United States Patent [19]

Burke et al.

[11] 3,983,689

[45] Oct. 5, 1976

[54] ELECTRONIC WATCH CONSTRUCTION

[75] Inventors: Roger A. Burke, Laguna Beach; Rudolf F. Zurcher, Newport Beach; Bela Somogyi, Costa Mesa, all of Calif.

[73] Assignee: Hughes Aircraft Company, Culver City, Calif.

[22] Filed: Mar. 31, 1975

[21] Appl. No.: 563,927

[52] U.S. Cl. .................................. 58/50 R; 58/23 R; 339/17 R

[51] Int. Cl.[2] ....................... G04B 19/30; G04C 3/00; H05K 1/00

[58] Field of Search .............. 58/23 R, 23 BA, 50 R, 58/52, 55; 339/17 R, 256 R

[56] References Cited

UNITED STATES PATENTS

| | | | |
|---|---|---|---|
| 3,838,568 | 10/1974 | Zurcher et al. | 58/23 R |
| 3,863,436 | 2/1975 | Schwarzschild | 58/50 R |
| 3,864,905 | 2/1975 | Richardson | 58/50 R |
| 3,910,029 | 8/1973 | Yamazaki | 58/50 R |

*Primary Examiner*—E. S. Jackmon

*Attorney, Agent, or Firm*—Allen A. Dicke, Jr.; William H. MacAllister

[57] ABSTRACT

Electronic substrate of the electronic watch is the principal carrier of the electronics and electrical interconnections. It carries two alignment notches with top and bottom spacers embracing the substrate and engaging the alignment notches. The visual horological display is located in the top spacer and the batteries are located in the bottom spacer. Springs press onto the substrate and are contactable for input to the watch electronics. All important parts are keyed together for ease of assembly and accuracy of alignment.

8 Claims, 10 Drawing Figures

Fig. 1.
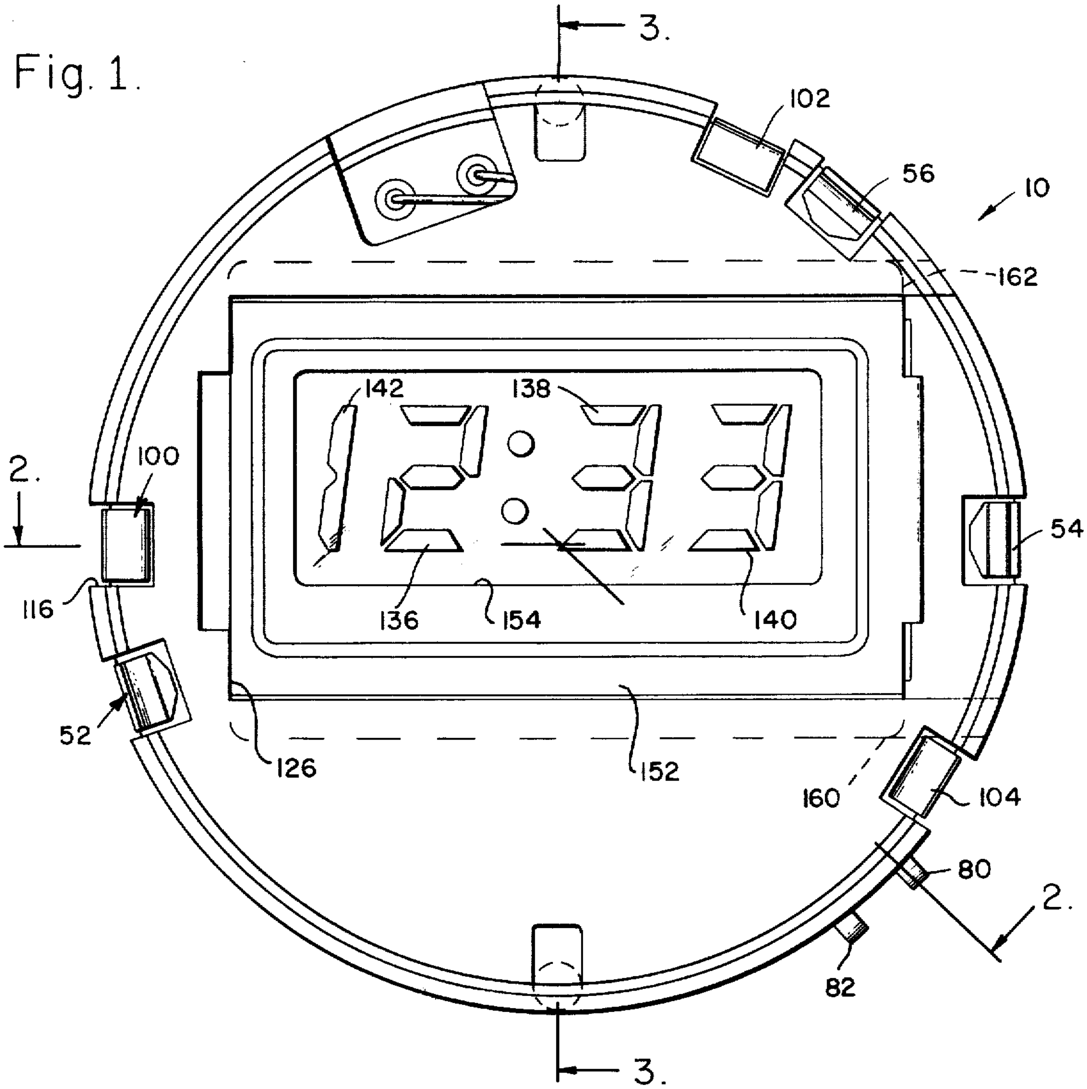
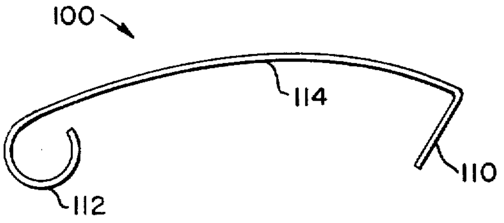
Fig. 6.
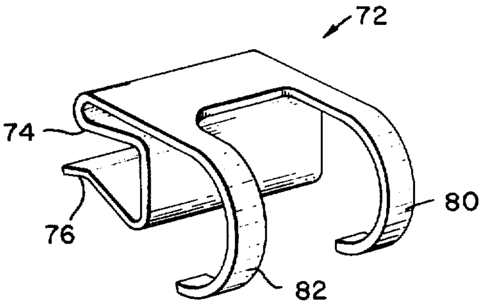
Fig. 10.

Fig. 7.
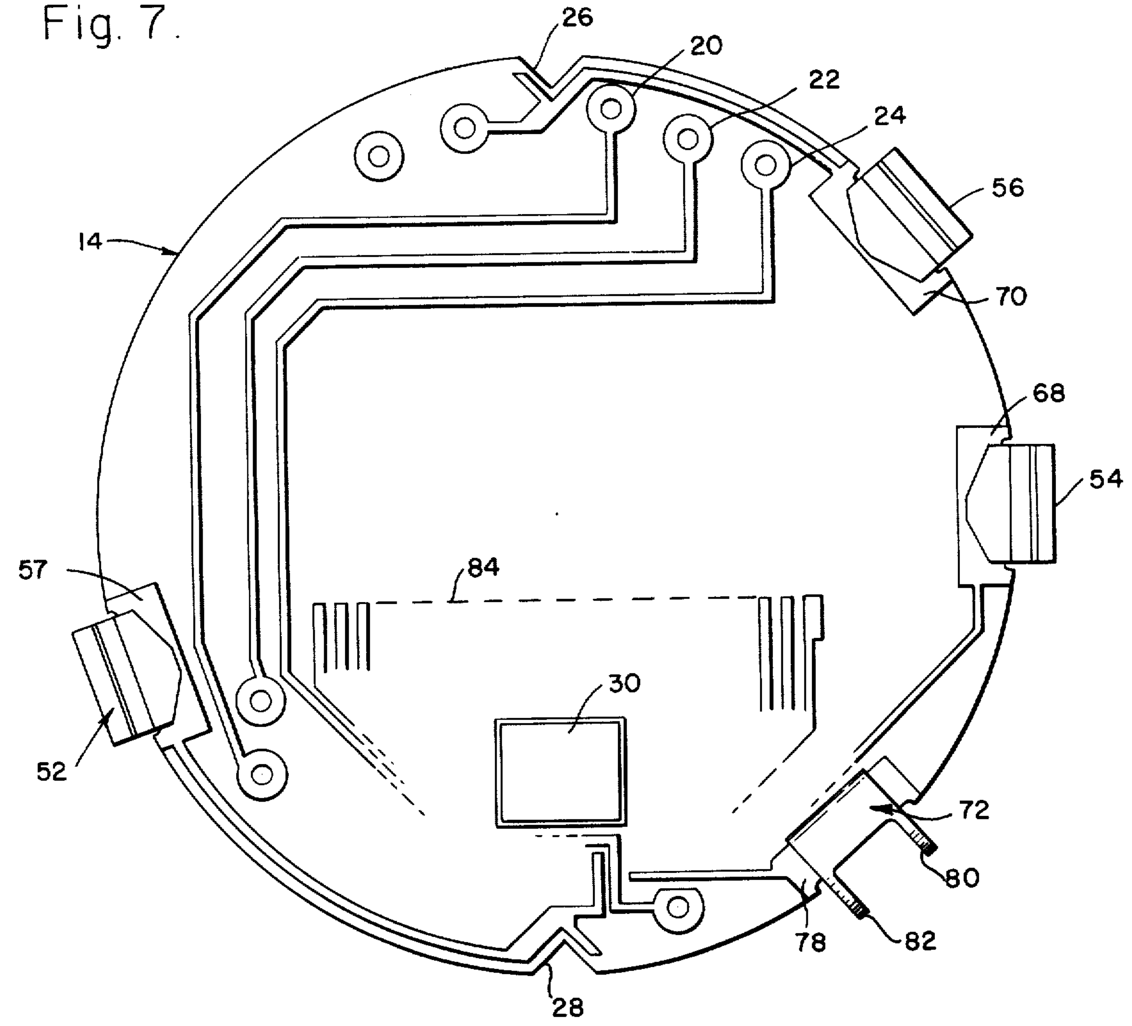
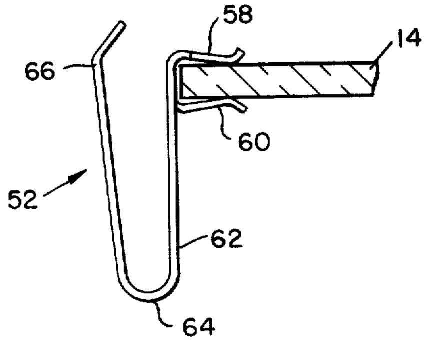
Fig. 8.
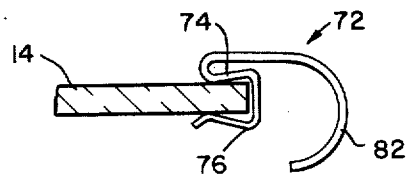
Fig. 9.

ELECTRONIC WATCH CONSTRUCTION

BACKGROUND OF THE INVENTION

This invention relates to the construction of an electronic watch, and particularly to the manner in which a watch substrate is mounted, protected and controlled within a watch case.

An electronic watch is one in which time increments are generated at a frequency in the order of kilocycles to megacycles per second, with dividers and memories for electronic time information processing. Readout is conveniently digital so that there are usually no movable mechanical parts except for switches to control the electronics. In recent years, there have been many inventions in electronic watches and many of the patents describe at least a portion of the physical constructions which interrelates the physical and electronic components. Pertinent background patents include McCullough et al. U.S. Pat. No. 3,759,031, Perkins et al. U.S. Pat. No. 3,784,725, Doss U.S. Pat. No. 3,846,972, Yamazaki U.S. Pat. No. 3,800,523 and Zurcher et al. U.S. Pat. No. 3,838,567. These patents are just a few in the large body of prior art in the electronic watch and related field and are offered as examples of patents which disclose some of the physical structure of electronic watch construction.

In assemblying an electronic watch the electronics must be supported and protected and must be related to other components for physical and electrical interconnections. The clamping, attachment, interconnection, and protection of the watch structure is a field in which concepts relating to economy reliability and serviceability must be applied. The prior art does not indicate the manner in which various design features should be optimized.

SUMMARY OF THE INVENTION

In order to aid in the understanding of this invention it can be stated in essentially summary form that it is directed to an electronic watch construction, and particularly a construction in which an electronic substrate is supported, protected, and connected in an electronic watch construction.

It is thus an object of this invention to provide an electronic watch construction which is convenient and economic to manufacture and assemble and provides a reliable and trouble free electronic watch. It is another object to provide an electronic watch construction wherein an electronic substrate carrying electronic elements is located and positioned within the watch and is protected and clamped so that the substrate and the components carried thereby are protected against damage from normal exterior forces. It is a further object to provide an electronic watch construction wherein the substrate has locating points thereon which can be used in the manufacture and assembly of components on the substrate and in which are engaged by a spacer block in the watch construction so that the substrate is located with respect to the spacer block and located to the remainder of the watch components. It is a further object to provide an electronic watch substrate carrying electronics thereon which is engaged between a pair of spacer blocks for location and protection. It is a further object to provide spacer blocks which locate the electronic watch display, an electronic substrate and other electrical structure such as batteries and switch parts so that the entire watch structure is physically interrelated. It is a further object to provide an electronic watch wherein electric connections to the substrate are accomplished at least in part by contact springs which resiliently engage over the edge of the substrate and onto an electric conductor thereon so that contact springs may be snapped in placed for convenient assembly and repair.

Other objects and advantages of this invention will become apparent from the study of the following portion of the specification, the claims and the attached drawings.

BRIEF DESCRIPTION OF THE DRAWINGS

FIG. 1 is a top plan view of a watch mechanism having the electronic watch construction of this invention.

FIG. 6 is a side view of one of the clamp springs which holds the watch construction together.

FIG. 7 is a top plan view of the watch substrate.

FIG. 8 is a side elevational view of one of the contact springs clamped on the edge of the substrate carrying its contact springs.

FIG. 9 is an elevational view of the ground contact spring clamped on the edge of the substrate.

FIG. 10 is an enlarged isometric view of the spring shown in FIG. 9.

DESCRIPTION

Figure 2:
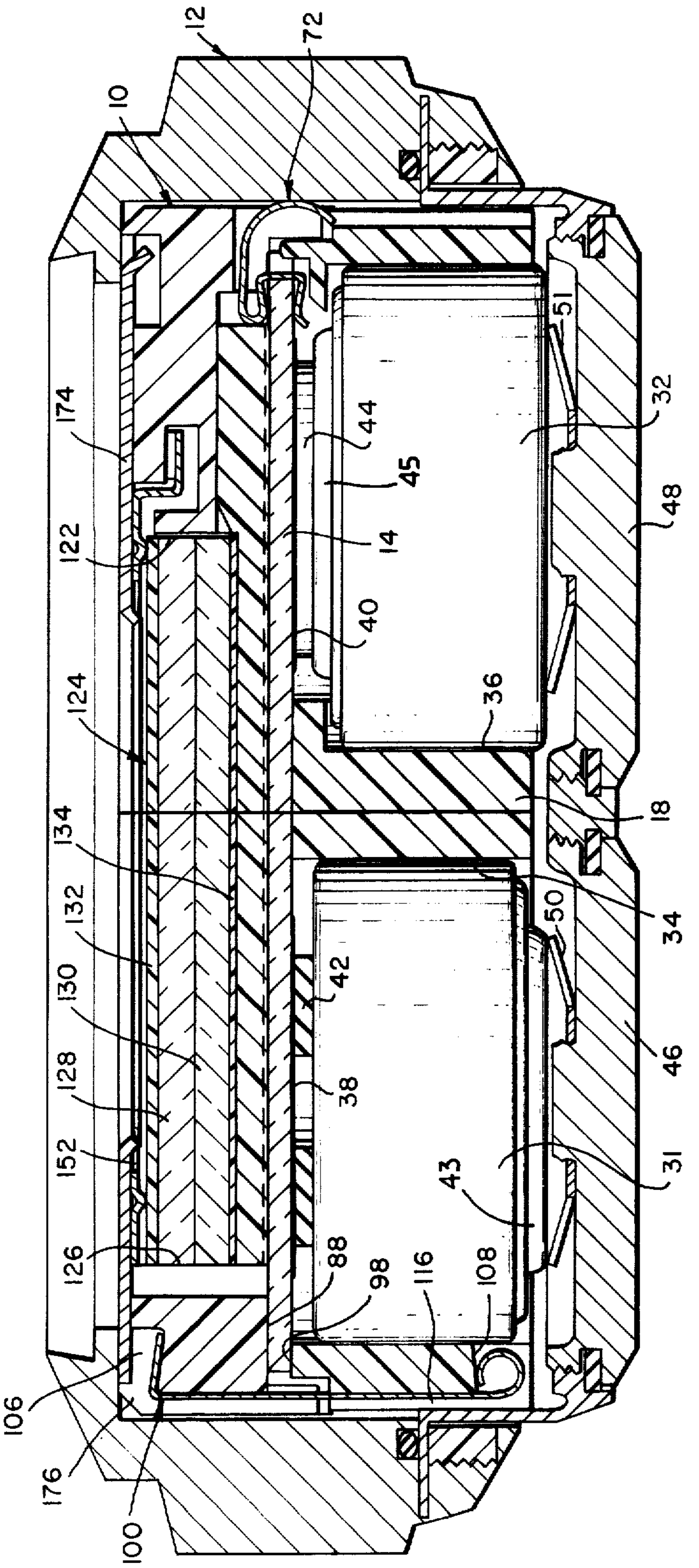
FIG. 2 is a section through the watch mechanism and its case taken generally along line 2—2 FIG. 1.
Figure 3:
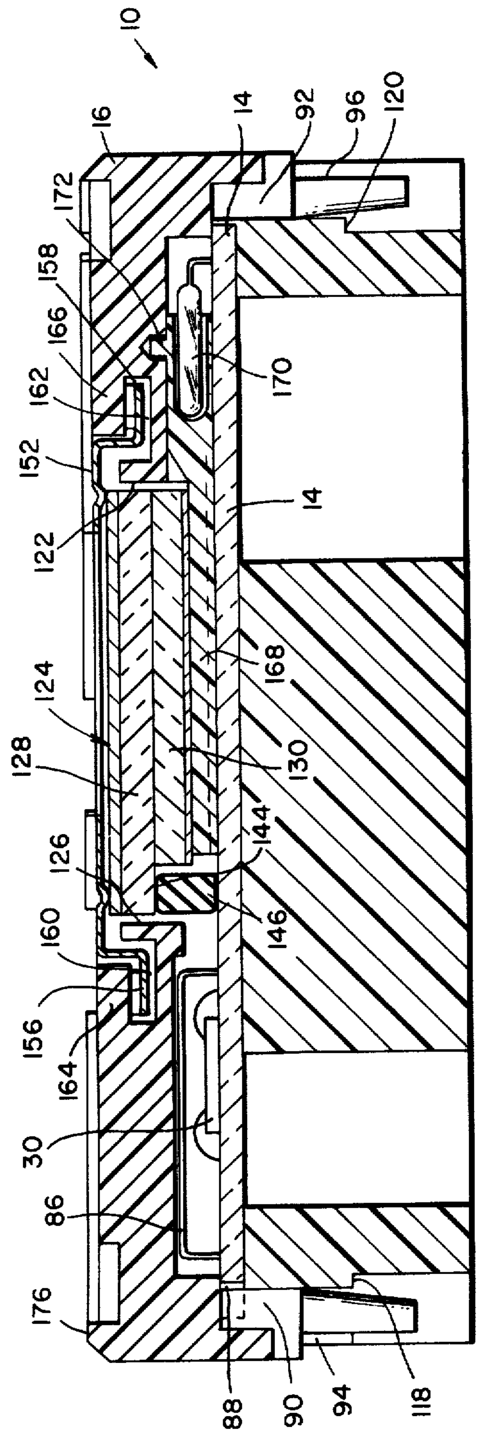
FIG. 3 is a section through the watch mechanism taken generally along line 3—3 of FIG. 1.

FIG. 2 shows the watch structure 10 of this invention in watch case 12. As is seen in FIGS. 2 and 3, watch structure 10 includes substrate 14 clamped between top space 16 and bottom spacer 18.

As seen in FIG. 7, substrate 14 is the principle carrier of the electronics and electrical interconnections of the electronic watch mechanism. Substrate 14 is preferrably a ceramic substrate for its dimentional stability, rigidity and insulation value. Printed circuitry is printed on the top as shown in FIG. 7. The quartz crystal of the watch is positioned below substrate 14 and is electrically connected at pads 20, 22 and 24 which are part of the integrated circuitry on the top of substrate 14. In order to properly locate substrate 14 during its manufacture, and during the printed circuit processing and attachment of elements, notches 26 and 28 are formed at edges for location of the substrate. These locating V notches are employed during the entire manufacturing process for positive location so that parts on the substrate are positively connected. Integrated circuit chip 30 is secured to the top of the substrate and is interconnected by wire bonds to the printed circuitry on the substrate.

In order to be effective, the substrate circuitry must be supplied with power, must be controllable and must have a useful display. Power is supplied by batteries 30 and 32, see FIG. 2, which are respectively positioned in battery pockets 34 and 36 in bottom spacer 18. Battery pads 38 and 40 are formed on the back of the substrate and are connected to the front by the usual vias. Elastomeric conductors 42 and 44 in the form of perforated discs are positioned between the batteries and the battery pads. These elastomeric conductors are used for electrical connection and spreading mechanical shock from the battery across a larger area of the substrate to help protect the substrate against damage. For further reference to this construction, attention is called to Patent Application Ser. No. 563,926 filed Mar. 31, 1975 by Bela Somogyi for Electronic Watch Construction. The batteries are accessible for replacement through battery hatches 46 and 48 through the back of the case. Battery contact force can be maintained by battery springs 50 and 52, but if the elastomeric conductors 42 and 44 are arranged for sufficient resilient displacement, the battery springs can be eliminated. Elastomeric conductors 42 and 44 are preferably silver powder filled silicone rubber, with sufficient silver powder to have almost undetectably small resistance.

In the control of the electronics on the substrate, switching is usually required. Switching is for the purpose of choosing a particular display, for example choosing an hours-minutes time display, a seconds display or a month-day display, whether or not the optical display device is a light emitting diode or a liquid crystal display. Also, control is required for the setting of the watch. In the case of liquid crystal displays, this structure preferably includes a lamp for illuminating the liquid crystal display on demand. Electric signals to the electronics in the watch are accomplished by manually operable electric switches. The section through the watch case in FIG. 2 is not a section through one of the push button switches, and thus the push button structure is not shown therein. Attention is called to the showing in R. F. Zurcher and I. B. Merles U.S. Pat. No. 3,838,568 for the details of the push button structure. In effect, the push buttons connect the potential of the case to a J shaped spring which is connected to the electronic circuitry. In the present disclosure, attention is called to contact springs 52, 54 and 56.

FIG. 8 illustrates contact spring 52 in more detail. Contact spring 52 is clamped over the edge of substrate 14 onto contact pad 56 which is connected to the watch circuitry. Clamp jaws 58 and 60 are formed on the top of downwardly extending spring leg 62 which is connected by band 64 to the upwardly extending contact leg 66 of contact spring 52. It is the upper part of contact leg 66 which is engaged by the push button to connect the case potential to the contact pads 57 to effect control of the electronics. As is seen in FIG. 2, the case potential is intermediate to potential of battery pads 38 and 40. When the push button engages the case voltage onto contact leg 66, pad 57 is connected to a potential between the potential of pads 38 and 40. This potential is fed to the integrated circuit chip 30 as input information for controlling the logic. Similarly, contact springs 54 and 56 are respectively connected on contact pads 68 and 70 which are also connected to the substrate circuitry. Manually operable push buttons are positioned in the case to contact each of these contact springs for various control modes of the electronics. The ground spring 72 and the contact springs can also serve to interconnect the contact circuitry spring on the top and bottom of the substrate.

Ground spring 72, see FIG. 7, 9 and 10 has upper and lower clamp jaws 74 and 76 for clamping over the edges of the substrate 14 as is shown in FIG. 7 and 9, and for engaging on contact pad 78 on the substrate. Contact pad 78 is also connected to the electronics. Ground spring 72 has contact spring fingers 80 and 82 for resilient engagement on the inside of the watch case, see FIG. 2. In this way, the intermediate voltage of the watch case is permanently connected with contact pad 78 to supply that potential to the circuitry on the substrate. Ground spring 72, like contact springs 52, 54 and 56 is formed of resilient metal for proper clamping and engagement and making of contact with the contact pads on the substrate and for making proper contact with the push buttons in the case, as required.

Precisely located on substrate 14 is a row 84 of contact strips. These contact strips are connected to carry the output signals from the watch electronics to the display. The contact strips are arranged in a single row and are closely spaced. As is seen in FIG. 3, cover 86 extends over integrated circuit chip 30 to protect it and to protect its associated wire bonds but the row 84 of contact strips extends out from underneath the cover so as to be accessible. Cover 86 can be of polymer composition material or can be metallic as long as it is mounted so that it does not short out the electronics.

Top spacer 16 has shoulder 88 against which substrate 14 rests. The shoulder supports the substrate around the periphery of the top surface, except for necessary cutouts to accomodate the contact springs and ground spring. Locating pins 90 and 92 are mounted on the underside of top spacer 16 and engage in notches 28 and 26 of the substrate. Thus, the substrate is positively located with respect to the top spacer. As stated above, locating notches 26 and 28 are used throughout the manufacturing operations on substrate 14 so that all of the parts thereon are located relative to the locating notches. Thus, all of the parts thereon are located with respect to top spacer when the substrate is in place under the top spacer. Bottom spacer 18 has corresponding locating notches into which the locating pins 90 and 92 extend. Thus, the bottom spacers also accurately located with respect to the substrate and the top spacer. Bottom spacer 18 has shoulder 98 engaged against the bottom of the substrate to clamp it firmly between the two spacers. As is seen in FIGS. 2 and 3, two spacers are clamped together so that these major parts of the watch structure are firmly clamped into the structure which can be handled and which provides the necessary support and protection to the substrate. Clamp springs 100, 102 and 104 engage in spring pockets in both the top and bottom spacers to clamp the spacers together. Spring pocket 106 in top spacer 16 and spring pocket 108 in bottom spacer 18 respectively receive hook end 110 and rolled end 112 of spring 100, see FIGS. 2 and 6. Shank 114 of the spring is slightly curved in the unstressed condition shown in FIG. 6, and it is this flexure as well as the flexure of rolled end 112 which produces the clamping force between the spacers. Furthermore, rolled end 112 is also stressed into a more curled, tightened position in the stressed condition of the spring, as can be seen by comparing FIG. 6 with FIG. 2. Spring pockets 106 and 108 are recessed inward, toward the substrate and in the radially inward direction of the pockets to prevent the clamp springs from inadvertently sliding out of the pockets. Recess 116 is provided in both the top and bottom spacers for accepting shank 114 of this spring. Each of the three springs 100, 102 and 104 is connected in such a way as to maintain the three parts together in integral electronic watch construction assembly. By removal of the three clamp springs, the assembly can be opened for gaining access to the substrate. However, such access is only required at a factory repair type of operation, for it is not anticipated that repairs on the substrate or replacement of a substrate would be accomplished at a jeweler type rapar activity. In order to obtain security to the three part assembly, shoulders 118 and 120, see FIG. 3, are provided in the bottom substrate adjacent the free ends of locating pins 90 and 92. When the top spacer 16 is made of thermal plastic material, the free ends of the locating pins can be heat softened and formed into the shoulders 118 and 120 to semipermanently fix together the three part assembly. This would assure that no access was gained to the substrate without knowledge.

Opening 122 is provided in top spacer 16 for receipt of display 124. Opening 122 is defined by shoulders 126 on all four sides of the display for locating the displaying position with respect to the top spacer. Display 124 can be any convenient type of display operable by the electronics, for example a segmental light emitting diode display, a similar electro luminescent dispaly or a liquid crystal display. In each case, the dispaly 124 is rectangular so as to fit within shoulders 126 to be located thereby, and perferably with a small amount of adjustment space available between the outer dimension of the display and the shoulders 126. In the present case, display 124 is a liquid crystal display having liquid crystal layer upper and lower cover plates 128 and 130 and upper and lower polarizers 132 and 134. The cover plates are arranged to have the necessary liquid crystal containing pocket, and electrodes for application of signals to control the liquid crystals. The electrodes are arranged so that a segment numeric display can be achieved, as shown in FIG. 1. The three numerals 136, 138 and 140 are each capable of being energized to selectively display the values 0 through 9. Numeral 142 is capable of being energized to display the numeral 1 or to be left blank. Similarly, the numeral 136 can be left blank during a display of only seconds. The colon dots are separately controllable for display purposes. As is best seen in FIG. 3, upper cover plate 128 is wider than the lower cover plate 130 to present downwardly directed surface 144. This surface extends all along one of the longer edges of the display and all of the display control conductors are brought out as a row of fingers extending outward across the surface. These fingers correspond electronically and are in parallel position with the row of contact strips 84.

Figure 5:
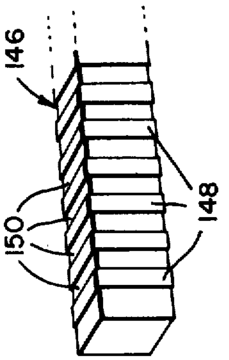
FIG. 5 is an enlarged partial perspective view of the connector between the display and the substrate.

Connector 146 is placed on the contact strips 84 and display 124 is laid thereon with the electronic control lines on surface 144 aligning against the connector. Connector 146 is shown in more detail in FIG. 5. Connector 146 is a plurality of conductive layers 148 and a plurality of insulator layers 150 therebetween. One conductive layer lies against one of the contact strips in row 84 and the same conductive layer lies against the corresponding contact strip on the downwardly directed space 144. Thus, electrical connection between the corresponding contact strips is achieved. Connector 146 can be completely made of resilient material, such as with each layer of silicone rubber with the layers 148 being milled with a metallic powder to make them conductive. Preferably the thickness of each conductive layer and each insulating layer is considerably narrower than (less than half) the corresponding width of the contact strips and spaces therebetween. Furthermore, connector 146 is slightly shorter than the space between the shoulders 126 at the ends thereof so that connector 146 can be longitudinally placed with its conductors on the contact strips 84. Thereupon, display 124 is placed on the top of the connector and is longitudinally adjusted to make the proper contacts and is then held in place.

Figure 4:
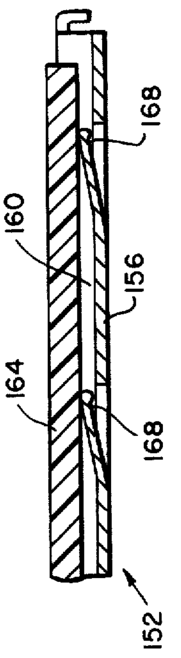
FIG. 4 is an enlarged partial section showing the edge details of the display hold down frame.

Clamp cover frame 152 retains display 124 in position. Clamp cover frame 152 is a rectangular frame, as is seen in FIG. 1, and contains an opening 154 through which the display can be viewed. Frame 152 has depressed outwardly extending flanges 156 and 158 which extend into corresponding slots 160 and 162 which are in the form of separated halves of a T-slot. Walls 164 and 166 are part of the top spacer and extend over the slots to permit the outward flanges of the frame to be retained. Frame 152 is metallic and is seen in FIG. 4 has spring fingers 168 pressed upwardly to resiliently engage under walls 164 and 166 to urge frame 152 downward in the clamping direction. This clamping urges the display downward and firmly clamps connector 146 in its proper connector position. Slots 160 and 162 extend laterally out of top spaces 16, as shown in FIG. 1, so that the display can be pressed down for lateral insertion and removal of frame 152. In this way, display 124 can be quickly and easily replaced.

In the perferred embodiment, display 124 is a liquid crystal display and as such requires at least a reflector below it. In the present structure, light pipe 168 serves as a reflector when outside illumination is adequate to observe the horological display, but also serves to introduce light to the rear of the liquid crystal display so that it can be read in very dim illumination. Lamp 170 is inserted in an appropriate pocket in the light pipe so that light is distributed to the entire rear face of the display. With all of the contact strips from the display to the substrate being along only one of the longer edges of the display, light pipe 168 is inserted under the display along the other long edge thereof. Lamp 170 is midway between the ends along one of the longer edges for maximum light dispersion through the light pipe over the entire back of the display. Thus, the display is evenly illuminated. Lamp 170 is electrically connected to the circuitry on the substrate so that it can be selectively illuminated by pressing a button. Light pipe 168 is located on the back of top spacer 16 by means of stud 172 which extends into a corresponding hole. The configuration of the opening in the bottom of top spacer 16 into which light pipe 168 is installed prevents excursion of the light pipe from position. For further details of the light pipe construction, see patent application Ser. No. 563,928 filed Mar. 31, 1975 by Bela Somogyi.

By this means, an electronic watch is built wherein manufacture and assembly provide for positive position control to minimize assembly skills and minimize the problems of later service. Dial plate 174 is installed inside of circular shoulder 176 to finish off the appearance of the front of the electronic watch construction. It has a finger pressed down into a recess in the top spacer, see FIG. 2, to rotational positioning. The shoulder 176 of the top spacer can be deformed over the dial plate to hold it in place. The entire watch structure 10 is then inserted in the case 12 with shoulder 176 engaging against the corresponding stop shoulder in the case. A key in the case engages in one of the spring slots in the spacer for angular orientation of the works in the case. Shoulder 176 extends sufficiently far upward and is sufficiently resilient to conform to the case configuration to spread loads and to absorb shock loading, so that the substrate is protected. Protection is also achieved with the use of elastomeric conductors 42 and 44 to spread the dynamic mechanical shock loads of the batteries onto the substrate. All cross reference material in this specification is incorporated herein in its entirety by this reference.

This invention having been described in its preferred embodiment, it is clear that it is susceptible to numerous modifications and embodiments within the ability of those skilled in the art, and without the exercise of the inventive skill. Accordingly the scope of this invention is defined by the scope of the following claims.

What is claimed is:

1. An electronic watch structure comprising:

a fired ceramic substrate having a face and having edges, with electronic watch components mounted on said face of said substrate;

first physical locating means on said substrate for laterally precisely positively physically locating said substrate;

a top spacer positioned on one side of said substrate, second locating means on said top spacer interengaged with said first locating means on said substrate to laterally positively locate said top spacer with respect to said substrate; and a bottom spacer positioned on the other side of said substrate, said bottom spacer having third physical locating means thereon for locating with respect to at least one of said first and second locating means.

2. The watch structure of claim 1 wherein said first locating means on said substrate comprises first and second notches cut into the edges of said substrate and said second locating means on said top spacer comprises locating pins which engage in said notches in said substrate.

3. The watch structure of claim 2 wherein said third locating means on said bottom spacer are notches engaged by said locating pins on said top spacer.

4. The watch structure of claim 3 wherein said locating pins are made of thermoplastic material so that they are thermoplastically deformable to engage with respect to said bottom spacer to retain said top and bottom spacers embraced around said substrate.

5. An electronic watch structure comprising:

a substrate having a face and a back and having electronic watch components mounted on said face of said substrate, first locating means on said substrate;

a top spacer positioned against said face of said substrate, second locating means on said top spacer;

a bottom spacer positioned against the back of said substrate, third locating means on said bottom spacer; and at least two clamp springs resiliently engaging both said top spacer and said bottom spacer to clamp said top spacer and said bottom spacer together in embrace against said substrate with said first, second and third locating means interengaged to positively laterally and rotatively locate said top and bottom spacers with respect to each other, said top spacer and said bottom spacer each having spring pockets therein for engagement by said clamp springs, said clamp springs each having a hook end engaged in one of said spring pockets and having a roll end engaged in the other of said spring pockets, said roll ends of said clamp springs being resiliently stressed to resiliently clamp said spacer together.

6. An electronic watch structure comprising:

a substrate having a face, said face of said substrate having electronic watch components thereon;

a top spacer positioned against said face of said substrate, an opening through said top spacer;

an optical display in said opening in said top spacer, said electronics on said face of said substrate including a row of contact fingers for carrying display information, a corresponding parallel row of contact fingers on said display facing said fingers onto the substrate;

a resilient connector positioned between said contact fingers on said display and said contact fingers on said substrate; and first and second T-slot halves in said spacer adjacent said opening in said top spacer, said T-slot halves being open to the edge of said top spacer, a frame engaging against said display for restraining said display with respect to said top spacer, said frame having first and second outwardly extending flanges respectively engaging in said first and second T-slot halves so that said frame can be slid out of said T-slot halves, and resilient fingers formed on said flanges for resiliently engaging in said slots to resiliently urge said display toward said substrate.

7. The watch structure of claim 6 wherein said opening in said top spacer has a shoulder therein for positioning said display with respect to said top spacer.

8. The watch structure of claim 7 wherein said shoulder is positioned along at least a portion of each edge of said display to locate said display with respect to said top spacer.

* * * * *